(12) United States Patent
Vackar

(10) Patent No.: US 7,142,428 B2
(45) Date of Patent: Nov. 28, 2006

(54) LOCKING HEATSINK APPARATUS

(75) Inventor: Mark A. Vackar, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 272 days.

(21) Appl. No.: 10/704,710

(22) Filed: Nov. 12, 2003

(65) Prior Publication Data

US 2005/0099779 A1    May 12, 2005

(51) Int. Cl.
  *H05K 7/20*    (2006.01)
(52) U.S. Cl. .................. 361/710; 361/709; 361/702
(58) Field of Classification Search ............... 174/16.3; 361/704, 710, 697, 719; 257/719
  See application file for complete search history.

(56) References Cited

U.S. PATENT DOCUMENTS

| | | | |
|---|---|---|---|
| 4,872,089 A | 10/1989 | Ocken et al. | |
| 4,899,255 A | 2/1990 | Case et al. | |
| 4,972,294 A | 11/1990 | Moses, Jr. et al. | |
| 5,184,281 A * | 2/1993 | Samarov et al. ............ | 361/704 |
| 5,864,464 A | 1/1999 | Lin | |
| 5,875,097 A | 2/1999 | Amaro et al. | |
| 5,886,870 A | 3/1999 | Omori | |
| 6,068,051 A * | 5/2000 | Wendt ........................ | 165/185 |
| 6,201,699 B1 * | 3/2001 | Ayres et al. ................. | 361/707 |
| 6,219,246 B1 | 4/2001 | Edevold et al. | |

* cited by examiner

*Primary Examiner*—Kamand Cuneo
*Assistant Examiner*—Ivan Carpio
(74) *Attorney, Agent, or Firm*—Banner & Witcoff, Ltd.

(57) ABSTRACT

A heatsink is provided for cooling power components on a printed circuit board. The heatsink includes a slot so that it is placed over the power device to be cooled. An activating member may be inserted from the opposite side of the printed circuit board and fastened into another slot running parallel to the slot containing the power device. The insertion of the activating member causes the wall between the device and the activating member to flex and clamp the power device in the slot.

17 Claims, 4 Drawing Sheets

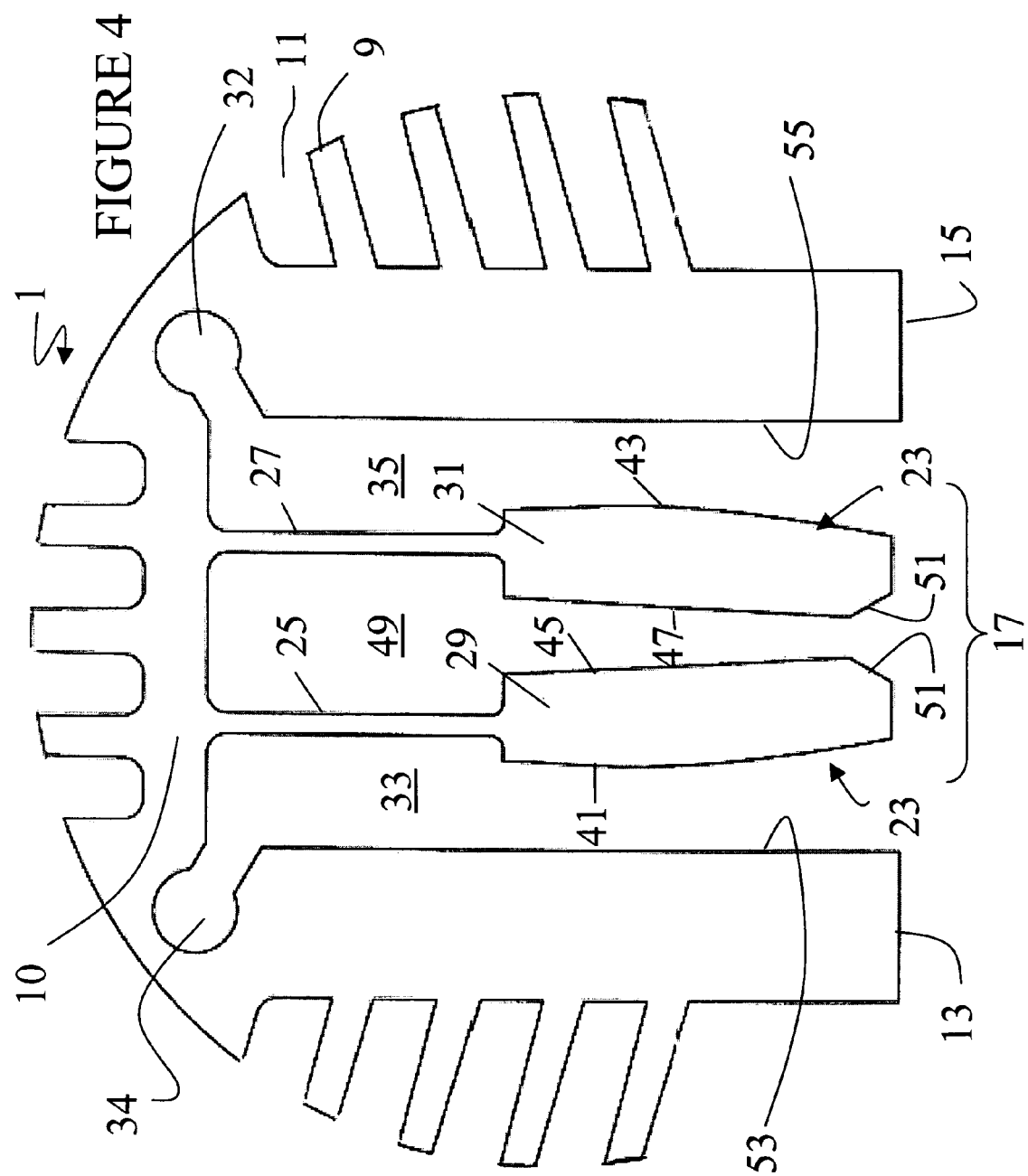

LOCKING HEATSINK APPARATUS

FIELD OF THE INVENTION

The present invention generally relates to a heatsink, which dissipates heat from an electronic device attached to a printed circuit board, and more particularly to a locking heatsink apparatus and method of securing an electronic device.

BACKGROUND OF THE INVENTION

An electronic device heats up as electric current flows through the device and the heat must be dissipated or removed from the device to prevent overheating. Cooling the electronic device is important in order to preserve its functionality and efficiency. Traditionally, an electronic device is cooled through both conduction and convection. After the heat is conducted from an electronic device through a heatsink, the heat may be then dissipated through convection via a flow of air.

Conventional heatsinks require that a hole be drilled and tapped for each device that is to be mounted to the heatsink. Fastening devices in this method is labor intensive and prone to defects. Some methods have been devised to use clips for clamping the devices either individually or as a group. The clamps still require extra parts and added assembly time. Some heatsinks with an integrated clip have been used on smaller devices in the past, but they relied on a simple spring clip to hold them to the device. The spring clips provide a limited the amount of pressure that could be applied and caused the weight of the heatsink to be supported by the device leads. Because the device leads were supporting the heatsink, the size of these past heatsinks was fairly limited. Another design used previously had a wedge shaped opening and the devices were simply wedged into the slot. This wedge design had significant flaws. In a wedge design, if more that one power device to be cooled was located in the same slot and the device heights were not precisely the same, then one device would make contact with the heatsink first leaving the other device loose and susceptible to overheating.

In another past attempts to dissipate heat from an electronic device, U.S. Pat. No. 6,219,246 entitled "Heat Sink Apparatus" describes use of a removable user-operated cam actuator connected to a cam and spring clips to secure a single device slot. While this particular apparatus does provide heat dissipate to some degree, there are several shortcomings. The shape and position of the spring clips may cause heat transfer discontinuities similar to past designs. An electronic device may not be adequately cooled and as a result, this configuration risk overheating the electronic equipment. Additionally, the heatsink device contains a multitude of individual parts that may increase manufacturing and assembly costs.

In view of the foregoing, a heatsink apparatus that overcomes the shortcomings was needed.

SUMMARY OF THE INVENTION

The present invention is generally directed to a heatsink apparatus which dissipates heat from an electronic device.

In one aspect of the present invention, a heatsink device includes two laterally opposing sidewalls coupled to a horizontal portion defining an interior compartment.

The heatsink device may include a heat conductive body having a plurality of laterally disposed movable clamp members within the interior compartment and depending away from the horizontal portion, the clamp members defining a plurality of apertures with respect to the sidewalls for receiving at least one power device therein, and the body including a linear activation aperture responsive to linear movement so as to provide a locking force to the at least one power device.

In one aspect of the present invention, a heatsink device includes laterally opposing clamping members. The heatsink device may include a heat conductive body with a plurality of movable device clamp members coupled to a horizontal section of the body. The clamp members defines a plurality of apertures for receiving at least one power device therein and, the body includes a linear activation aperture for providing an off-axis force the least one power device.

In other aspects of the present invention, a heatsink device may include laterally opposing clamping portions and a horizontal portion defining an interior compartment. The heatsink device may include a heat conductive body having a plurality of lateral movable device clamp members disposed within the interior compartment and depending away from the horizontal portion, the clamp members defining a plurality of device slots for receiving at least one power device therein, and the body may include a linear activation slot for providing a off-axis locking force to the at least one power device.

In yet another aspect of the invention, a heat conductive body has laterally opposing non-movable clamping portions and a horizontal portion defining an interior compartment. The heat conductive body includes a device locking means for lockingly engaging at least one power device and for conducting heat therefrom; and a linear lock activating means for receiving a linear force to provide an off-axis force to the at least one power device and cooperating with the device locking means.

The above and other aspects, features and advantages of the present invention will be readily apparent and fully understood from the following detailed description of preferred embodiments, taken in connection with the appended drawings.

BRIEF DESCRIPTION OF THE DRAWINGS

FIG. 4 is an enlarged view of an interior portion of the locking heatsink of FIG. 1 according to the teachings of the present invention.

DETAILED DESCRIPTION OF THE PREFERRED EMBODIMENTS

Figure 1:
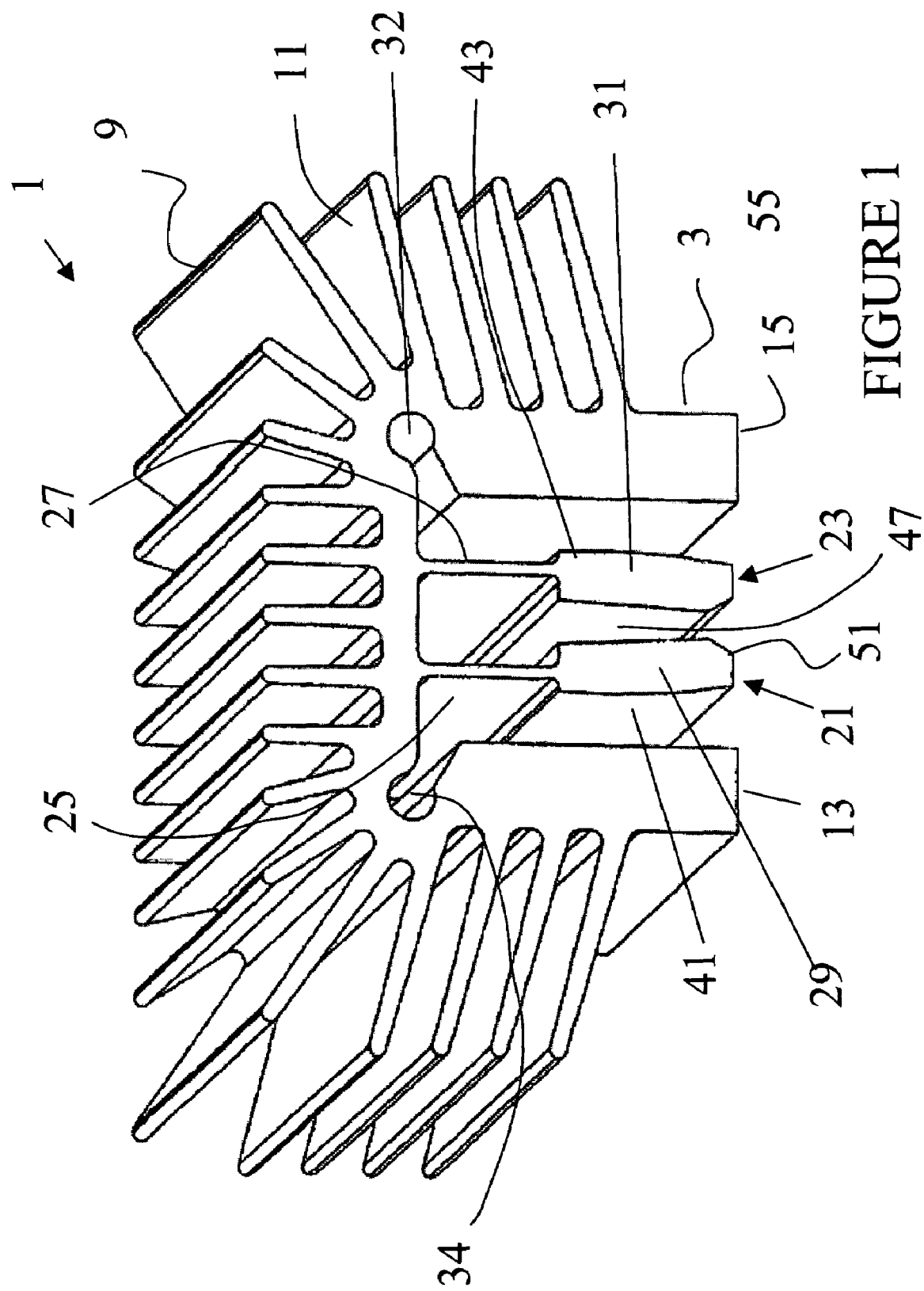
FIG. 1 is a first schematic perspective view of a locking heatsink that can be used to implement various aspects of the invention.

FIGS. 1–4 illustrate an embodiment of the present invention, generally referred to as a heatsink apparatus 1. The heatsink apparatus 1 may comprise a heatsink body 3 having set of heat dissipation protrusions 9 or thermal fins 9 extending from an exterior surface 10.

The heatsink body 3 may be supported by two laterally disposed of sidewall members 13, 15 which rest on a planar surface, such as a printed circuit board 61 (see FIG. 4). The sidewall members 13, 15 extend upwardly to integrally form with a horizontal heatsink member 10. This configuration defines an interior compartment 3 of the heatsink body 3. As best seen in FIG. 4, the interior compartment includes a device receiving aperture system 17 that is adapted to lockingly receive one or more power devices 4. The interior compartment surfaces provide heat absorption and conductive heat dissipation of the power device 4. The term "power device" is used herein to include electronic components, which have a device body 5 with one or more extending device leads 7. Examples of a power device may include but are not limited to resistors, capacitors, microprocessors and the like. The heat sink body 3 may include thermal fins 9 which define several cooling channels 11 that increases the convective surface area to improve the heat dissipation characteristics of the heatsink apparatus 1.

Figure 2:
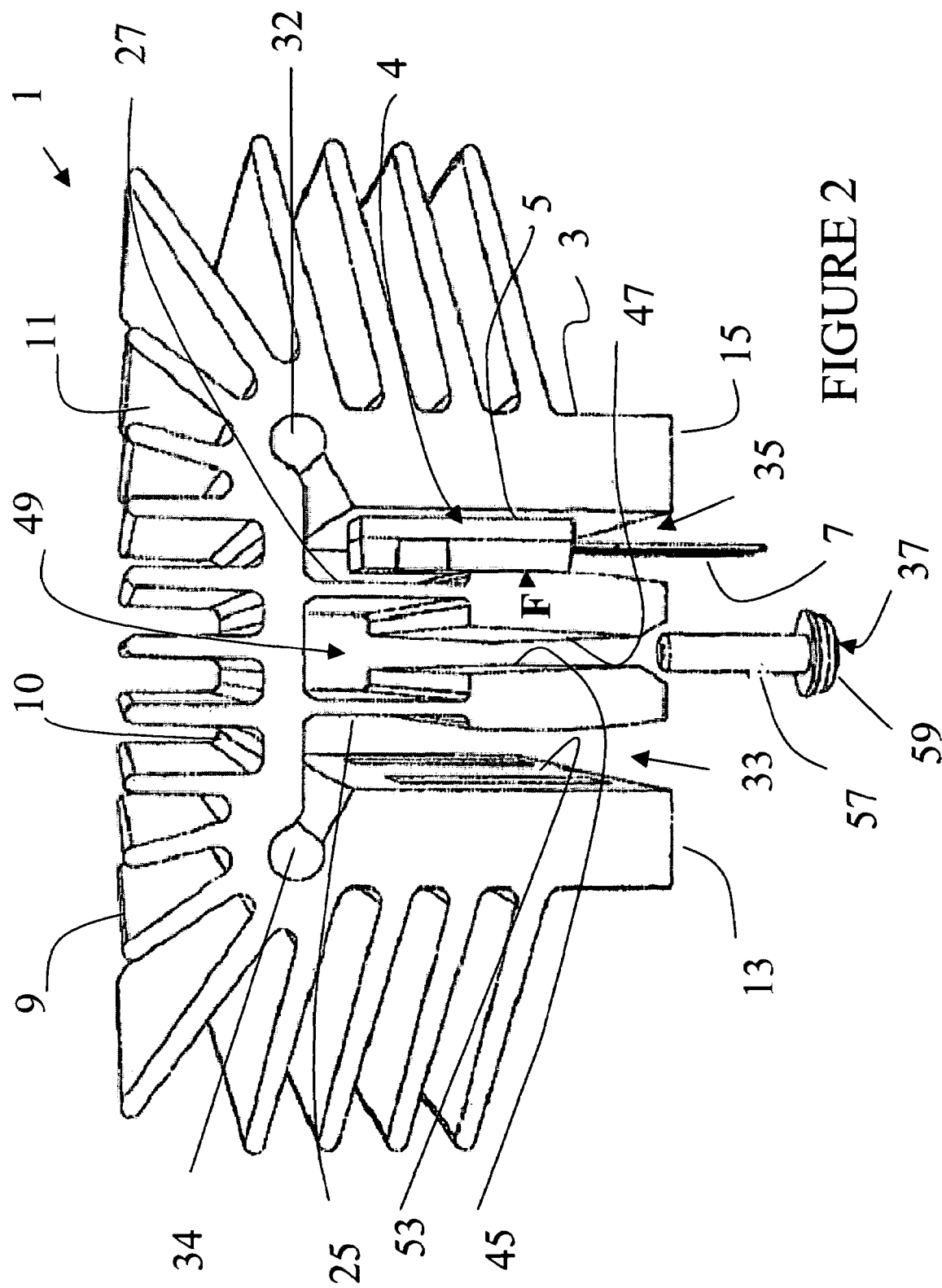
FIG. 2 is a second schematic perspective view of the locking heatsink illustrating an arrangement with an inserted power device and an activation member, according to the teachings of the present invention.
Figure 3:
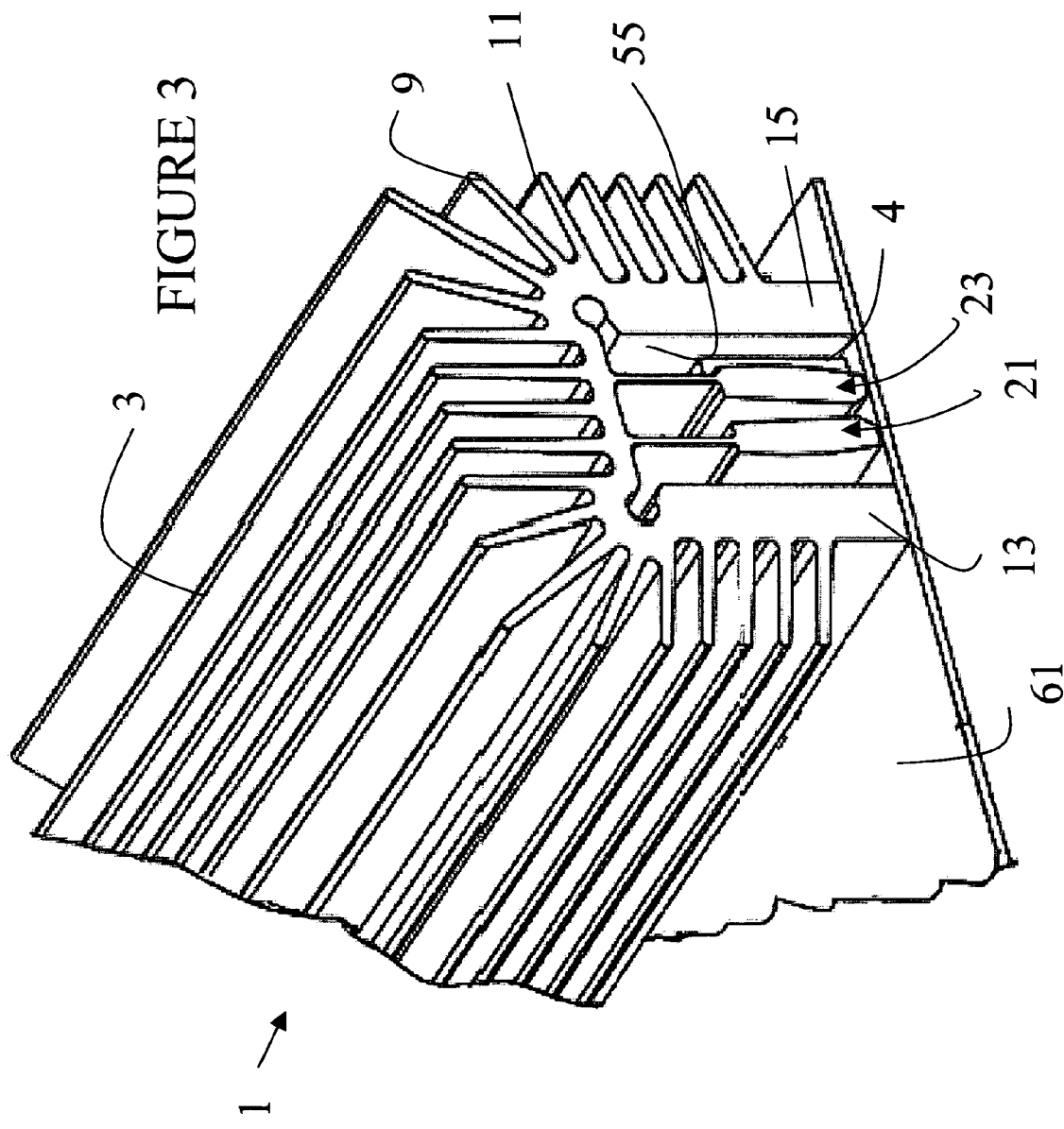
FIG. 3 is a partial perspective view of a locking heatsink of FIG. 1 in an installed environment for cooling electronic equipment.

Referring to FIGS. 1–4, the device receiving aperture system 17 includes two laterally disposed movable clamping members which run parallel or substantially parallel to each other—a first clamping member 21 and a second clamping member 23. It should be recognized that a substantially parallel configuration is intended to compensate for manufacturing tolerances or other variations. As seen in FIG. 4, an outer spacing between each of the clamping members 21, 23 and the respective sidewall members 13, 15 define two device receiving apertures or slots—a first aperture 33 and a second aperture 35. The inner spacing between each of the clamping members 21, 23 defines a locking slot or locking aperture 49. The device receiving aperture 33 and 35 enable the power device 4 be to inserted therein and be lockingly secured by an off-axis force F so as to prevent the power device 4 from dislodging. In this configuration, the clamping members 21 and 23 cooperate with the respective sidewall member 15 which serves as non-movable clamping members. As shown in FIG. 2, in one embodiment of the invention, the heatsink apparatus 1 operates in conjunction with a lock activation member 37 when inserted into the locking aperture 49 so as to provide an off-axis force F to secure power device 4 therein.

Referring to FIGS. 1 and 4, each movable clamping member 21, 23 may comprise a resilient portion 25, 27 with a downwardly depending rigid portion 29, 31. The resilient portion 25, 27 extends from the horizontal heatsink surface 10 to bend laterally so as to force the power device 4 in an abutment relation against sidewall members 13, 15. The resilient portion 25, 27 maybe formed with a thin planar member that enables the movable clamping member 21, 23 to advantageously bend in opposing lateral directions responsive to the power device 4 or lock activation member 37. The resilient portion 25, 27 enables the apertures 33 and 35 to receive power devices of varying sizes and shapes. Because shapes or dimensions for electronic power devices may vary, this feature improves the design flexibility for electronics designers and enhances the adaptability of the heatsink apparatus 1 for different configurations. In another aspect, the resilient portion 25, 27 and rigid portion 29, 31, being formed of a heat conductive material, permits heat to dissipate through the horizontal heatsink surface 10, which further enhances the heat dissipation capabilities of the heatsink apparatus 1.

As can be seen in FIGS. 1 and 4, the rigid portion 29, 31 of the movable clamping member 21, 23 may include a heat conductive contact surface 41, 43 for effective heat conduction and mechanically securing of the power device 4 to the heatsink apparatus 1. In an arrangement of the clamping member 21, 23, the heat conductive contact surface 41, 43 may be a continuous surface throughout the length of the clamping members 21, 23 thereby avoiding heat transfer gaps or discontinuities. In one arrangement, the conductive contact surface 41, 43 may have a substantially convex shape with respect to the sidewall member 13, 15 so as to concentrate a locking off-axis force applied to the power device body 5. Additionally, the convex shape of contact surface 41, 43 enables an easier insertion of the power device 4 into the receiving aperture 33, 35, by guiding therein. It should be recognized that a substantially convex configuration is intended to compensate for manufacturing tolerances or other variations.

As shown in FIGS. 1 and 2, the rigid portion 29, 31 of the movable clamping member 21, 23 may comprise an engagement surface 45, 47 which slidably receives the lock activation member 37 therein to lockingly engage the power device 4. In one arrangement, the engagement surface 45, 47 may be formed as an incline surface or angular surface with respect to a vertical plane. In this configuration, a "V" shaped locking aperture 49 is defined to receive the lock activation member 37 therein. This locking aperture 49 may run parallel or substantially parallel to the receiving apertures 33, 35 through the length of the heatsink body 3. It should be recognized that a substantially parallel configuration is intended to compensate manufacturing tolerances or other variations.

In addition to providing heat conduction, the inclined surface 45, 47 enables use of lock activation members of a wide variety of varying shapes and sizes. The rigid portion 29, 31 may include chamfered tip 51 which further defines the entrance of the locking aperture 49. The chamfered tip 51 provides a smooth transition so as to ease the amount of force used to insert an object therein, such as lock activation member 37. In one arrangement, the inclined surface 45, 47 may have formation structures in order to receive different locking members and provide securing functions. In one arrangement, the inclined surface 45, 47 may have a ridge formation so as to receive, for example, a threaded screw which may function as a lock activation member 37. This configuration enables the heatsink apparatus 1 to have additional fastening capability to a planar surface, such as a printed circuit board 61 (See FIG. 4).

Referring to FIG. 2, the lock activation member 37 may be used to secure the heatsink apparatus 1 to another device. In addition to fastening capabilities, the lock activation member 37 may also serve to secure the power device 4 to the heatsink body 3 within the device receiving aperture system 17. The locking function of the heatsink apparatus 1 is activated by a rectilinear movement of the lock activation member 37 within the middle aperture of the device receiving aperture system 17. In operation, the lock activation member 37 is inserted linearly into the locking aperture 49 through the entrance so that the surfaces of the lock activation member 37 slidably abut engagement surfaces 45, 47. This linear movement subsequently causes the movable clamping members 21, 23 to spread outward and laterally flex towards the sidewall member 13, 15 to create an off-axis lateral force "F" against the power device 4. This lateral movement simultaneously narrows device receiving apertures 33, 35. The narrowing of the apertures 33, 35 forces the power device 4 against interior surface 53, 55 of the sidewall member 13, 15. It should be recognized that two opposing off-axis forces are simultaneously applied when the both apertures 33, 35 have a power device therein.

It is should be recognized that the lock activation member 37, while inserted in the locking aperture 49, may also serve as a heat conductive member. Those skilled in the art will appreciate that various components may be used as a lock activation member 37, such as non-threaded components and of various shapes and configurations. For example, a lock activation member 37 need only have an elongated member 57 connected to a button 59. The elongated member 57 may have a cylindrical shape, or may be a rectangular shape, sized to enter the locking aperture 49 and slidably abut the engagement surfaces 45, 47. In a threaded arrangement, the lock activation member 47 may be embodied as screws, bolts or the like.

It is contemplated that the heatsink apparatus 1 may form an extensible structure so that the interior compartment 3 and device receiving aperture system 17 may be expanded to include many more power device slots 33, 35 or lock activation member slots 49. With a plurality of slots in close proximity to one another, the attached electronic device would benefit from greater power density. The lock activation member that secures the power device 4 to the heatsink apparatus 1 can also advantageously designed to support varying power device heights. Therefore, power density and height restrictions would not be a significant concern for electronics developers. The sidewall members 13, 15 improve the distribution of weight so that the device leads 7 have reduced stress.

In one arrangement, the heatsink body 3 may be a unitary structure which better enables heat to uniformly dissipate from the heatsink apparatus 1. The material used to manufacture the heatsink body 3 can be any appropriate heat conductive material, such as metal or a metal alloy. In one configuration, the material is a light weight metal with a high heat conductivity. An example of such a metal is aluminum. Also a single piece of heat conductive material has advantages in the manufacturing process of a heatsink apparatus 1. Several methods may be used to make such an apparatus including but not limited to casting and extrusion. These methods generally require a single step to create such a heatsink body 3 since there is no assembly needed with separate pieces. Advantageously, the assembly phase of production is enhanced or nearly eliminated because there are no other pieces to assemble the body 3 using casting or extension techniques.

In a further arrangement, the apertures 33, 35, and 49 advantageously provide improved power density and convective cooling of power devices on a printed circuit board where space is often limited. If desired, the lock activation member 37 may be inserted in the aperture 33 or aperture 35 and a power device may be inserted in the aperture 49. This feature advantageously allows the power devices to be used in different configuration of the heatsink body 3.

The thermal fins 9 illustrated in FIGS. 1 and 4, serve to increase the surface area of the heatsink for convective heat transfer. It should be recognized that that the increase of heat transfer surface allows for improved heat dissipation into the ambient air. In one arrangement, the fins 9 protruding directly from the horizontal surface 10 are substantially parallel and the fins protruding directly from sidewall member 13, 15 are substantially parallel as well. The parallel arrangement help to provides more uniform cooling of the power device 4 in the heatsink body 3. The substantial parallel configuration is intended to compensate for manufacturing tolerances or other variations. In a further, arrangement, the power device 4 abuts the interior surface of the sidewall member 13, 15 and the exterior surface includes extending thermal fins 9. In this configuration, heat generated by the power device 4 can be dissipated more quickly and efficiently due to the presence of the thermal fins 9.

Additional cooling is obtained when the heatsink body 3 is coupled with a heat transfer fluid, such as air.

With continued reference to FIGS. 2 and 4, the interior compartment 4 may further include a plurality of cooling channels 32, 34. In one arrangement, the cooling channels 32, 34 are located above the apertures 33, 35 located in the joining region between the horizontal heat surface 10 and sidewall members 13, 15. The cooling channels 32, 34 advantageously provide convective currents that may improve the cooling of the power device. This arrangement also increases the amount of heatsink surface area exposed to ambient air or another gaseous coolant.

SUMMARY

In one arrangement of the present invention, a heatsink apparatus 1 is provided for cooling power components on a printed circuit board 61. In another arrangement, a heatsink apparatus 1 may include a slot so that it is placed over the power device 4 to be cooled. An activating component 37 can be inserted from the opposite side of the printed circuit board 61 and fastened into another slot running parallel to the slot containing the power device. The insertion of the activating component 37 causes the wall between the device 4 and the component 37 to flex and clamp the power device 4 in the slot. In one arrangement of the heatsink apparatus, the clamping functionality is integrated as part of the heatsink body 3. Heat may be also extracted through the clamping member themselves, thereby enabling improved transfer of heat from the power device 4. One or more mounting members 37 used to tie the heatsink to the printed circuit board 61 cause a power devices to be clamped to heat absorption surfaces of the heatsink apparatus. By having the mounting members to activate the clamping function, the problems with device mounting heights with regard to poor fits and poor heat dissipation on conventional designs are eliminated. In one arrangement, a heatsink apparatus may have its weight supported on a printed circuit or other surface thereby allowing for a much larger heatsink and greater heat dissipation.

Although the invention has been defined using the appended claims, these claims are exemplary in that the invention may be intended to include the elements and steps described herein in any combination or sub combination. Accordingly, there are any number of alternative combinations for defining the invention, which incorporate one or more elements from the specification, including the description, claims, and drawings, in various combinations or sub combinations. It will be apparent to those skilled in the relevant technology, in light of the present specification, that alternate combinations of aspects of the invention, either alone or in combination with one or more elements or steps defined herein, may be utilized as modifications or alterations of the invention or as part of the invention. It may be intended that the written description of the invention contained herein covers all such modifications and alterations.

What is claimed is:

1. A heatsink device in combination with a circuit board, the heatsink device comprising:
    laterally opposing sidewalls coupled to a horizontal portion defining an interior compartment,
    a heat conductive body including a plurality of laterally disposed movable clamp members within the interior compartment and depending away from the horizontal portion, the clamp members defining a plurality of apertures with respect to the sidewalls for receiving at least one power device therein, and the heat conductive body including an activation aperture responsive to a linear movement therein so as to provide a locking force to the at least one power device; wherein a locking activation member has a first portion configured to extend through an aperture in a circuit board for operatively engaging the activation aperture and to provide the linear movement and a second portion of the locking activation member is configured to conduct heat away from the at least one power device via the aperture.

2. The heatsink device in accordance with claim 1, in which each of the movable clamp members are further comprised of a flexible upper member extending from the horizontal portion coupled with a lower rigid member having a device contact surface for engaging the at least one power device.

3. The heatsink device in accordance with claim 1, in which each of the movable clamp members include an inclined shaped member for receiving a locking member.

4. The heatsink device in accordance with claim 1, in which each of the movable clamp members are further comprised of a flexible upper member extending from the horizontal portion coupled with a lower rigid member having an inclined surface defining the activation aperture.

5. The heatsink device in accordance with claim 1, in which each of the movable clamp members are further comprised of a flexible upper member extending from the horizontal portion coupled with a lower rigid member having a convexly shaped surface for engaging the at least one power device and concentrating the locking force thereon.

6. The heatsink device in accordance with claim 1, in which the activation aperture is disposed between the movable clamp members.

7. The heatsink device in accordance with claim 1, in which each of the movable clamp members are further comprised of an upper flexible clamp member extending from the horizontal portion of the interior compartment and a lower device contact member.

8. The heatsink device in accordance with claim 1, in which the heat conductive body includes a plurality of thermal fins extending from the sidewalls.

9. A heatsink device having two laterally opposing non-movable clamping portions and a horizontal portion defining an interior compartment, the heatsink device, comprising: a heat conductive body including a plurality of convective cooling channels and a plurality of lateral movable device clamp members disposed within the interior compartment and depending away from the horizontal portion, the clamp members defining a plurality of apertures for receiving at least one power device therein, and the body including a linear activation aperture for providing an locking force to the at least one power device; wherein a perimeter of the interior compartment includes at least one interior sidewall surface being generally parallel to a vertical axis, the cooling channels having a surface intersecting with the at least one interior sidewall surface and the surface being disposed off-axis to the vertical axis.

10. The heatsink device in accordance with claim 9, in which each of the movable clamp members are further comprised of a flexible upper member extending from the horizontal portion coupled with a lower rigid member having a device contact surface for engaging the at least one power device.

11. The heatsink device in accordance with claim 9, in which each of the movable clamp members include an inclined shaped member for receiving a locking member.

12. The heatsink device in accordance with claim 9, in which each of the movable clamp members are further comprised of a flexible upper member extending from the horizontal portion coupled with a lower rigid member having an inclined surface defining the linear activation aperture.

13. The heatsink device in accordance with claim 9, in which each of the movable clamp members are further comprised of a flexible upper member extending from the horizontal portion coupled with a lower rigid member having a convexly shaped surface for engaging the at least one power device and concentrating the locking force thereon.

14. The heatsink device in accordance with claim 9, in which the linear activation aperture is disposed between the clamp members.

15. The heatsink device in accordance with claim 9, in which each of the movable clamp members are further comprised of an upper flexible clamp member extending from the horizontal portion of the interior compartment and a lower device contact member.

16. The heatsink device in accordance with claim 9, in which the heat conductive body includes a plurality of thermal fins extending from the non-movable clamping members.

17. The heatsink device in accordance with claim 9, further comprising an activation member for operatively engaging the linear activation aperture.

* * * * *